[19] United States Patent
Butterwick

[11] Patent Number: 4,639,590
[45] Date of Patent: Jan. 27, 1987

[54] INTENSIFIED CHARGE-COUPLED IMAGE SENSOR HAVING A CHARGE-COUPLED DEVICE WITH CONTACT PADS ON AN ANNULAR RIM THEREOF

[75] Inventor: Gilbert N. Butterwick, Upper Leacock Township, Lancaster County, Pa.

[73] Assignee: RCA Corporation, Princeton, N.J.

[21] Appl. No.: 705,707

[22] Filed: Feb. 26, 1985

[51] Int. Cl.⁴ .............................................. H01J 31/50
[52] U.S. Cl. ............................ 250/213 VT; 250/211 J
[58] Field of Search ........... 250/213 R, 213 VT, 578, 250/332, 207, 211 J; 357/24 LR, 32; 313/523, 531, 540, 528

[56] References Cited

U.S. PATENT DOCUMENTS

| | | | |
|---|---|---|---|
| 3,640,792 | 2/1972 | Alleman et al. | 156/345 |
| 3,887,810 | 6/1975 | Skaggs | 250/213 VT |
| 3,925,657 | 12/1975 | Levine | 250/211 J |
| 4,266,334 | 5/1981 | Edwards et al. | 29/583 |
| 4,355,229 | 10/1982 | Zimmerman et al. | 250/213 VT |
| 4,360,963 | 11/1982 | Jastrzebski | 29/571 |
| 4,465,549 | 8/1984 | Ritzman | 156/630 |
| 4,555,731 | 11/1985 | Zinchuk | 250/213 VT |

Primary Examiner—David C. Nelms
Attorney, Agent, or Firm—Eugene M. Whitacre; Dennis H. Irlbeck; Vincent J. Coughlin, Jr.

[57] ABSTRACT

An intensified charge-coupled image sensor comprises an image intensifier section and a header assembly. The image intensifier section includes an envelope having therein a photoemissive cathode for emitting photoelectrons in a pattern corresponding to the intensity of radiation incident thereon. The header assembly includes a charge-coupled device with a front surface having a plurality of electrodes adjacent thereto and a back surface directed toward the cathode. The charge-coupled device is improved by forming it on a disc-shape semiconductor wafer having a center portion and an annular rim portion, the center portion has a thickness less than that of the annular rim portion. A plurality of contact pads are formed around at least a portion of the rim portion. The contact pads are electrically connected to different ones of the plurality of electrodes.

2 Claims, 8 Drawing Figures

INTENSIFIED CHARGE-COUPLED IMAGE SENSOR HAVING A CHARGE-COUPLED DEVICE WITH CONTACT PADS ON AN ANNULAR RIM THEREOF

BACKGROUND OF THE INVENTION

The present invention relates to an intensified charge-coupled image sensor and, particularly, to the charge-coupled device (CCD) which is utilized therein.

An intensified charge-coupled image sensor 10, shown in FIG. 1, comprises an image intensifier section having a photoemissive cathode (not shown) on an interior surface of an input faceplate and a header assembly having a charge-coupled device (CCD) 12 located at the focal plane of the image sensor. Such a structure is described in U.S. Pat. No. 4,355,229, issued to H. S. Zimmerman et al. on Oct. 19, 1982, and assigned to the assignee of the present invention. The Zimmerman et al. patent is incorporated by reference herein for the purpose of disclosure.

The operation of the intensified charge-coupled image sensor 10 is well understood. During the so-called integration time, a scene is projected onto the photoemissive cathode on the interior surface of the input faceplate, and photoelectrons are released therefrom in a pattern corresponding to the intensity of the radiation incident on the cathode. The photoelectrons impinge upon the A register of the CCD 12 shown in FIG. 2.

Upon the completion of the integration time (e.g., during the vertical blanking interval of commercial television), the charge signals which have accumulated (a "field") are transferred, in parallel, in the column direction from the A to the B register by the application of the multiple phase voltages $\phi_{A1} \ldots \phi_{A3}$ and $\phi_{B1} \ldots \phi_{B3}$. The charges subsequently are transferred a row at a time, from the B register to the C register, and after each row of charges reaches the C register, it is serially shifted out of the C register in response to the shift voltages $\phi_{C1} \ldots \phi_{C3}$. The transfer of charges from the B to the C register occurs during a relatively short time (the horizontal blanking time of commercial television, which is about 10 μs) and the serial shifting of the C register occurs at relatively high speed (during the horziontal line display time of commercial television). During the transfer of a field from the B to the C register, a new field may be integrated in the A register.

When the CCD 12 is used in an intensified charge-coupled image sensor 10, it is necessary to thin the substrate, at least in the A register to a thickness of about 10μ (microns) to minimize lateral dispersion of the charge produced by the incident photoelectrons. The B and C registers are masked to prevent photoelectrons from impinging thereon.

In one practical approach to thinning substrates, the number of CCD's 12 produced on a wafer is relatively small. First, using a two-inch silicon wafer, up to three such devices, each about 12.7 mm×20.3 mm (0.5 inches×0.8 inches), as shown in FIG. 3, are fabricated at the same time on a common substrate, employing photolithographic techniques. Then, two of the three devices are masked, that is, except for the back surface of the device being thinned, the entire wafer is coated with a substance (a "resist") which is not attached by the chemical bath (an acid) used to thin the substrate. Then, the entire wafer is immersed in the thinning bath, and the wafer is spun about an axis passing through the center of the device being thinned. After the desired amount of thinning of the device is obtained, the wafer is removed from the bath, the resist is removed, and, then, the masking and other processing steps are repeated for each additional device. Then, the wafer is cut apart in such a way that there is a thick substrate border surrounding the thin A register of each device. This thick border, shown in FIG. 4, provides some stiffness and mechanical support for the relatively fragile thinned substrate region of the A register.

While the process above has resulted in the production of many operational CCD's 12, it is not without its problems. One is that it is difficult to obtain uniform thinning throughout the entire imaging portion of the A register of the device. It is thought that because of the rectangular shape of the device, the acid bath sometimes does not attack as strongly some of the edge and corner regions of the device as the center of the device, and these edges and corners, therefore, are sometimes thicker in the final product than the center region of the device. Such non-uniformity is undesirable as it sometimes causes non-uniformities in the picture information produced by the imager. Also, as a practical matter, one cannot manufacture at the same time a large number of devices on the same wafer, even a large wafer. If one were to employ a larger wafer, say 4" or 5" in diameter, there would be problems in spinning the wafer during thinning about an axis considerably displaced from the center of the wafer, and, therefore, it would be difficult to utilize the outer edge portion of the wafer (recall that the axis about which the spinning takes place passes through the center of the region being thinned). In addition, the yield using this method is not as high as desired. Also, because of the fragility of the thinned substrate, it is very difficult to test the devices after they are thinned. The reason is that the test probes tend to cause the thinned substrate to become broken or otherwise damaged.

U.S. Pat. No. 4,266,334, issued to T. W. Edwards et al. on May 12, 1981, and incorporated by reference herein for the purpose of disclosure, describes a method of manufacturing a large number of thinned substrate CCD's on a single semiconductor wafer. Instead of thinning the A registers of the individual CCD's one at a time, as in the previous process described above, the entire wafer is thinned in a rotary etch bath to the desired thickness over its entire center area, leaving only an unthinned rim around the peripheral edge of the wafer for support. Then, a glass plate is laminated or glued onto the thinned surface of the wafer to add structural support during testing and removal of the individual CCD's from the large wafer. If the CCD's are to be used as "images", i.e., solid state devices in which photons are imaged directly on the CCD, then it is not necessary to remove the glass plate. The glass support plate must, however, be delaminated or otherwise removed from the wafer before the CCD's contained therein can be used in an intensified charge-coupled image sensor. The glue used to affix the glass plate to the CCD is incompatible with the formation of the photoemissive cathode formed on the interior surface of the input window of the image intensifier section of the image sensor, and the glass window also attenuates the photoelectrons from the cathode, thereby preventing them from impinging upon the A register of the CCD.

U.S. Pat. No. 4,465,549, issued to I. G. Ritzman on Aug. 14, 1984, and assigned to the assignee of the present invention, discloses a method of removing the glass support plate from a thinned wafer containing a large number of CCD's. The wafer is subsequently sectioned to provide the individual CCD's 12. As shown in FIG. 5, each of the thinned CCD's 12 has a substantially uniform thickness of about 10μ and is too delicate to handle without damage. Thus, copending U.S. patent application Ser. No. 494,288, filed by J. A. Zollman et al. on May 13, 1983, discloses a support frame (not shown) which is brazed to one surface of a thinned CCD to provide the required rigidity for handling and mounting the CCD 12 within the intensified charge-coupled image sensor 10. In prior art intensified charge-coupled image sensors 10, the CCD 12 with the attached frame is brazed to an insulative header. The initial brazing of the frame to the CCD and the subsequent brazing of the frame with the attached CCD to the insulative header has resulted occasionally in scrape due to the flow of braze material onto the CCD and to misalignment of the CCD on the insulative header.

It has been determined that the overall yield of CCD's for use in intensified charge-coupled image sensors and produced by the above-described methods must be increased in order to lower the cost of the intensified charge-coupled image sensors. More specifically, the fabrication of the CCD must be tailored to the requirements of the intensified charge-coupled image sensor, and those processing steps which are not compatible with the subsequent processing and operation of the intensified charge-coupled image sensor must be eliminated. Furthermore, it is desirable to provide a CCD, which is uniformly thin in the active register areas, i.e., in the A, B and C registers, yet has a sufficient structural integrity, thereby obviating the need for brazing a support frame to the periphery of the device.

SUMMARY OF THE INVENTION

An intensified charge-coupled image sensor comprises an image intensifier section and a header assembly. The image intensifier section includes an envelope having therein a photoemissive cathode for emitting photoelectrons in a pattern corresponding to the intensity of radiation incident thereon. The header assembly includes a charge-coupled device with a front surface having a plurality of electrodes adjacent thereto and a back surface directed toward the cathode. The charge-coupled device is improved by forming it on a disc-shape semiconductor wafer having a center portion and an annular rim portion, the center portion has a thickness less than that of the annular rim portion. A plurality of contact pads are formed around at least a portion of the rim portion. The contact pads are electrically connected to different ones of the plurality of electrodes.

DETAILED DESCRIPTION OF THE PREFFERRED EMBODIMENT

Figure 6:
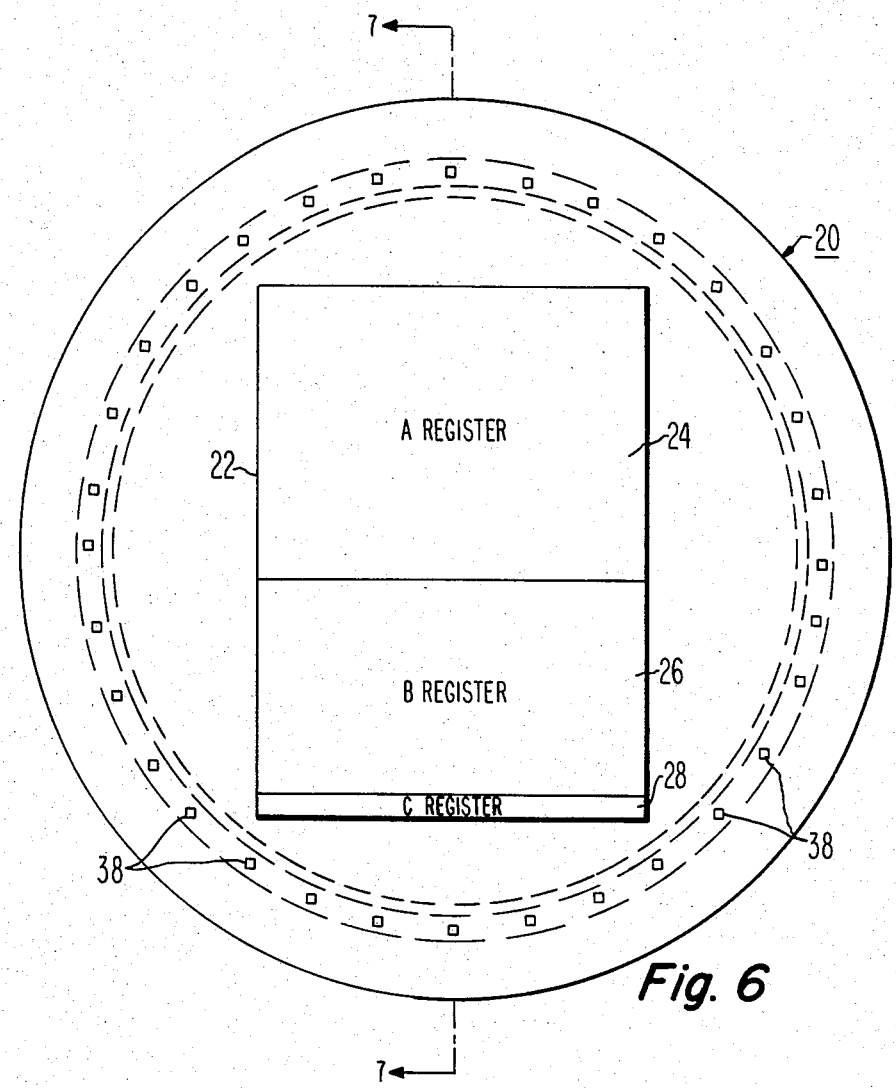
FIG. 6 is a plan view of a wafer containing a single CCD according to the present invention.
Figure 7:
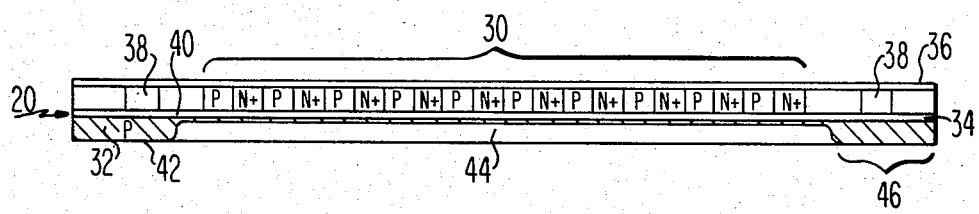
FIG. 7 is a sectional view of the wafer containing the CCD taken along line 7—7 of FIG. 6.

With reference to FIGS. 6 and 7, a disc-shaped semiconductor wafer 20, preferably silicon, is processed using conventional photolithographic techniques to form a charge-coupled device (CCD) 22. The CCD 22 includes various regions doped with N type conductivity atoms and other regions doped with P type conductivity atoms, so as to define the various channels along which the charge is stored and transferred. The known structure of the CCD 22 includes an imaging array or A register 24, a temporary storage array or B register 26, and an output or C register 28. The A and B registers, 24 and 26, have channel stop (not shown) extending in the column direction to isolate the channels (the columns of the CCD) from one another. A plurality of electrodes 30, which may be of the single layer type comprising, for example, N+ type regions of polysilicon separated by P type regions of polysilicon, extend in the row direction and, in the preferred embodiment, are three-phase operated. The electrodes 30 are insulated from the P type substrate 32 of the wafer 20 by a layer of silicon dioxide ($SiO_2$) 34 and covered by a second layer of $SiO_2$ 36. The CCD 22, described herein, has 320 columns and 512 rows (256 in the A register and 256 in the B register), each row comprising a group of three electrodes. In the novel CCD 22, a plurality of contact pads 38 are radially disposed around the wafer 20 and electrically connected by leads (not shown) to different ones of the plurality of electrodes 30.

The disc-shaped wafer 20 has a front surface 40 on which the electrodes 30 and contact pads 38 are formed and a back surface 42, which is selectively thinned by methods known in the art, so as to form a recessed center portion 44 having a thickness of about 10μ (microns). The thinning provides an annular rim portion 46 having a thickness of about 0.2 mm (0.008 inches). Unlike prior art CCD's in which the contact pads are formed opposite the thinned portion of the device, the present novel wafer 20 is of reduced diameter so that the contact pads 38 are formed on the relatively thick rim portion 46. This structure obviates the need of cementing a glass support plate into the recess formed in the thinned wafer to permit testing of the CCD's, as described about in U.S. Pat. No. 4,266,334 to T. E. Edwards et al., and of removing the glass plate, as described above in U.S. Pat. No. 4,465,549 to I. G. Ritzman. While the contact pads 38 are shown in FIG. 6 to be evenly distributed around the wafer 20, the location of the contact pads 38 is for illustration only and, preferably, they are spaced to minimize the length of the leads connecting the contact pads 38 to the electrodes 30 of the CCD 22.

Figure 1:
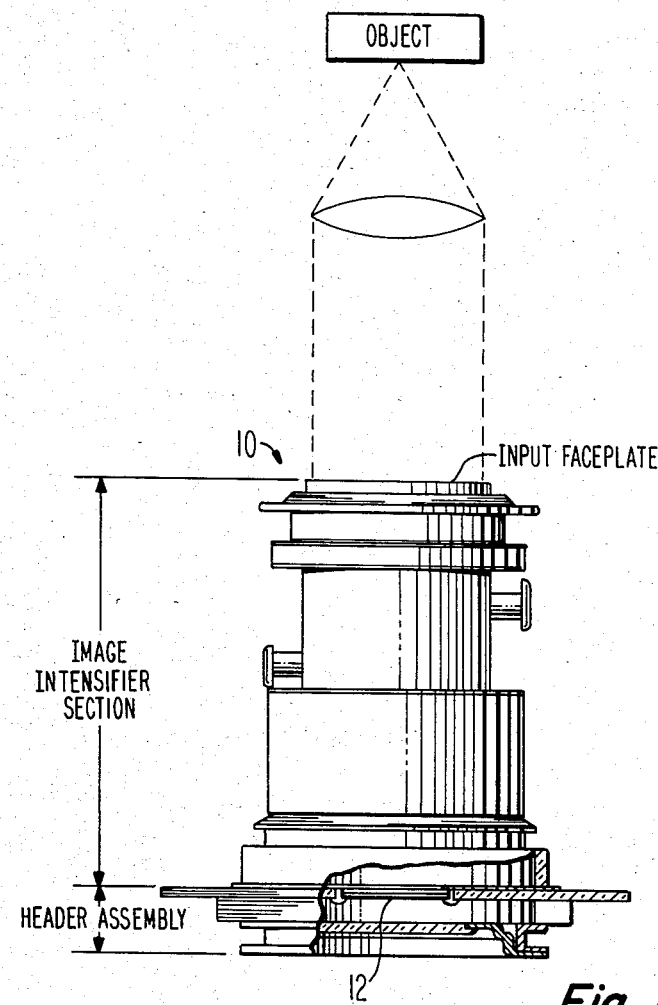
FIG. 1 is an elevational view, partially in section, of a prior art intensified charge-coupled image sensor having a scene imaged on an input faceplate thereof.
Figure 2:
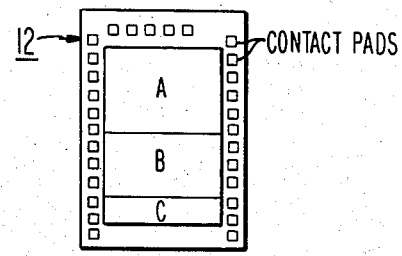
FIG. 2 is a schematic representation of a prior art charge-coupled device (CCD).
Figure 3:
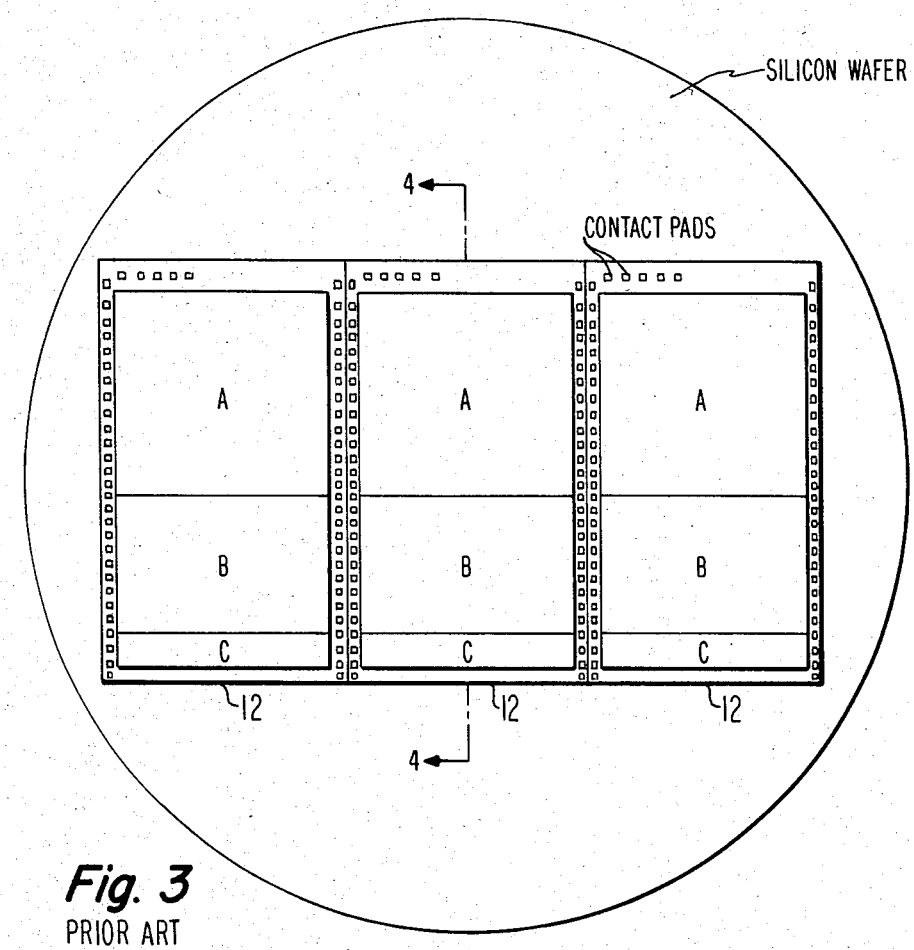
FIG. 3 is a plan view of a wafer containing a plurality of prior art CCD's.
Figure 4:
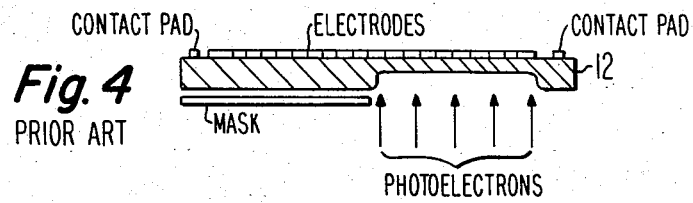
FIG. 4 is a sectional view of one of the prior art CCD's taken along line 4—4 of FIG. 3, showing a thinned A register.
Figure 5:
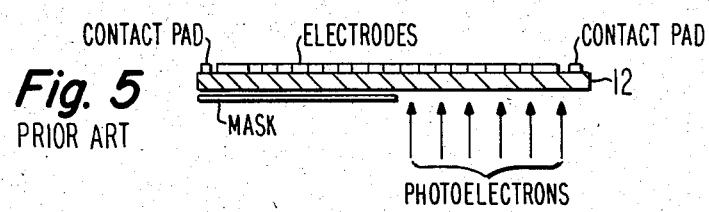
FIG. 5 is a sectional view of another prior art CCD showing a device which has been thinned uniformly.
Figure 8:
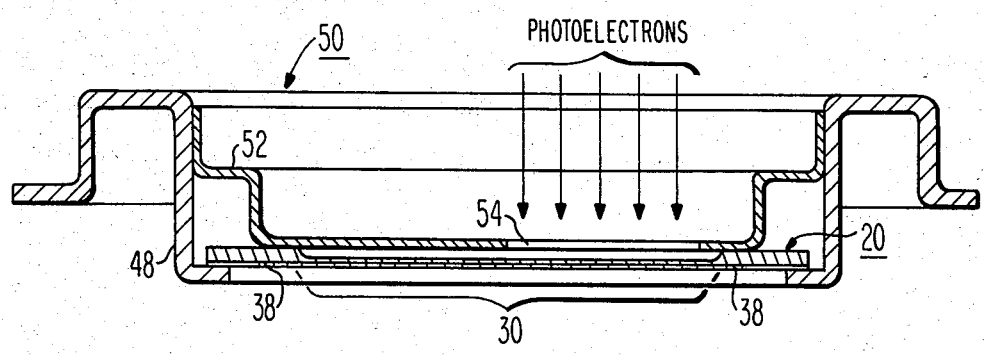
FIG. 8 is a sectional view showing the wafer and CCD of FIG. 6 mounted within a CCD support assembly.

In the preferred embodiment, the disc-shaped wafer 20 has an overall diameter of about 14.73 mm (0.58 inches). The center portion 44 of the back surface 42 is thinned to provide a thinning diameter of about 11.68 mm (0.46 inches). The contact pads 38 are formed on the front surface 40 within an annular ring having a diameter ranging from about 11.94 mm (0.47 inches) to about 12.83 mm (0.505 inches). As shown in FIG. 8, this location of the contact pads 38 provides adequate spacing between the contact pads 38 and a lower support member 48 of a charge-coupled device support assembly 50 and permits wire bonding between the contact pads 38 and electric leads of the header assembly (see FIG. 1). The support assembly 50 further includes an upper tensioning member 52 having a substantially rectangular imaging aperture 54 therethrough. The upper tensioning member 52 is oriented so that the imaging aperture 54 exposes the A register 24 of the CCD 22 to photoelectrons from the cathode of the image intensifier section (not shown).

While the present novel architecture provides only one CCD 22 on the wafer 20 as compared to a plurality of CCD's on each prior art wafer, the advantages outweigh the disadvantages. In the present novel structure, the center part 44 of the wafer 20 is uniformly thinned in the regions of the A register 24, the B register 26 and the C register 28. This uniformity of thinning overcomes the prior art disadvantage of thinning only the A register, wherein the edges and corners of the A register were thicker than the center of the A register, causing non-uniformities in the picture information produced by the CCD. The integral rim portion 46 of the present wafer 20 also obviates the need to pattern, metalize and braze a support frame to the back surface of the CCD which occasionally results in loss of a CCD due to shorts caused by the braze material. The novel architecture of the wafer 20, which locates the contact pads 38 on the rim portion 46 rather than on the thinned portion of the wafer, eliminates the need for cementing a glass support plate into the thinned portion to permit electrical probe testing of the CCD. Finally, since the novel wafer 20 contains only one CCD 22, the entire wafer 20 is mounted in the charge-coupled device support assembly 50 which supports and tensions the CCD to provide a flat surface on which the photoelectrons from the cathode impinge. With only one CCD 22 on the wafer 20, there is no need to section the wafer to remove the device as in the prior art. Prior art wafers contained three or more CCD's, and some CCD's were occasionally broken when the wafer was sectioned to separate the CCD's.

What is claimed is:

1. In an intensified charge-coupled image sensor of the type comprising
    an image intensifier section including an envelope having therein a photoemissive cathode for emitting photoelectrons in a pattern corresponding to the intensity of radiation incident thereon, and
    a header assembly spaced from said cathode, said header assembly including a charge-coupled device with a front surface having a plurality of electrodes adjacent thereto and a back surface directed toward said cathode for receiving photoelectrons therefrom,
    wherein the improvement comprising
        said charge-coupled device being formed on a disc-shaped semiconductor wafer having a center portion and an annular rim portion, said center portion having a thickness less than that of said annular rim portion, said rim portion having a plurality of contact pads around at least a portion thereof which are electrically connected to different ones of said plurality of electrodes.

2. In an intensified charge-coupled image sensor of the type comprising
    an image intensifier section including an evacuated envelope having therein a photoemissive cathode for emitting electrons in a pattern corresponding to the intensity of radiation incident thereon, and
    a header assembly spaced from said cathode, said header assembly including a charge-coupled device with a front surface having a plurality of electrodes adjacent thereto and a back surface directed toward said cathode, said charge-coupled device including an imaging array for receiving electrons from said cathode and an output register, wherein the improvement comprising
        said charge-coupled device being formed on a disc-shaped semiconductor wafer, said wafer having a center portion, including said imaging array and said output register, and an annular rim portion circumscribing said center portion, said rim portion having a thickness substantially greater than that of said center portion, said rim portion including a plurality of contact pads therearound which are electrically connected to different ones of said plurality of electrodes.

* * * * *